United States Patent [19]
Tallaksen

[11] Patent Number: 5,255,430
[45] Date of Patent: Oct. 26, 1993

[54] METHOD OF ASSEMBLING A MODULE FOR A SMART CARD

[75] Inventor: Kent A. Tallaksen, Fountain, Colo.

[73] Assignee: Atmel Corporation, San Jose, Calif.

[21] Appl. No.: 959,031

[22] Filed: Oct. 8, 1992

[51] Int. Cl.$^5$ .............................. H01R 43/00
[52] U.S. Cl. ...................... 29/827; 29/740; 174/52.4
[58] Field of Search ............. 29/827, 739, 740, 753; 174/52.4; 437/207

[56] References Cited

U.S. PATENT DOCUMENTS

| | | | |
|---|---|---|---|
| 4,459,607 | 7/1984 | Reid | 257/753 |
| 4,460,825 | 7/1984 | Haghiri-Tehrani et al. | 29/827 X |
| 4,514,785 | 4/1985 | Parmentier | 174/52.4 X |
| 4,549,247 | 10/1985 | Hoppe et al. | 174/52.4 X |
| 4,746,392 | 5/1988 | Hoppe | 29/827 X |
| 4,829,666 | 5/1989 | Haghiri-Tehrani et al. | 29/827 X |
| 4,835,846 | 6/1989 | Juan et al. | 29/827 X |
| 4,850,105 | 7/1989 | Nakajima et al. | 29/827 X |
| 4,889,980 | 12/1989 | Hara et al. | 235/488 |
| 4,996,411 | 2/1991 | Rebjock | 235/488 |
| 5,057,460 | 10/1991 | Rose | 437/217 |
| 5,057,679 | 10/1991 | Audic et al. | 235/492 |

FOREIGN PATENT DOCUMENTS

| | | |
|---|---|---|
| 4129160 | 5/1992 | Fed. Rep. of Germany . |
| 57-49258 | 3/1982 | Japan ........ 29/827 |
| 58-159355 | 9/1983 | Japan ........ 29/827 |
| 1-251786 | 10/1989 | Japan ........ 29/739 |

OTHER PUBLICATIONS

Crea, Jjohn J. et al., "Development of a Z-Axis Adhesive Film for Flex Circuit Interconnects and TAB Outer Lead Bonding," reprint from *NEPCON West '91 Proceedings*, 1991, pp. 251-259.

Gilbert, Barry K. et al., "Development of Deposited Multichip Modules with Unique Features for Application in GaAs Signal Processors Operating above 1 Ghz Clock Rates," reprint from *1991 IEPS Proceedings*, 1991, pp. 526-541.

Gilleo, Ken, "Direct Chip Interconnect Using Polymer Bonding," *IEEE Transactions on Components, Hybrids, and Manufacturing Technology*, vol. 13, No. 1, Mar., 1990, pp. 229-234.

Hogerton, P. B. et al., "An Evaluation of a Heat-Bondable, Anisotropically-Conductive Adhesive as an Interconnection Medium for Flexible Printed Circuitry," reprint from *IEPS '90 Proceedings*, 1990, pp. 1-8.

Hogerton, Peter B. et al., "Investigations into the Use of Adhesives for Level-1 Microelectronic Interconnections," *Materials Research Society Symposium Proceedings*, vol. 154, 1989, pp. 415-424.

*Primary Examiner*—Carl J. Arbes
*Attorney, Agent, or Firm*—Schneck & McHugh

[57] ABSTRACT

A card-independent method of forming a module for subsequent attachment to a card body includes increasing both the area and the height of contact pads on an integrated circuit die and includes forming a leadframe in which contact sites are electrically connected to the contact pads of the die by Z-axis epoxy. The epoxy is unidirectionally conductive, so that the epoxy as a mechanical link, an electrical link, and acts as an overcoating of the active side of the die A die-alignment layer having a center cavity properly positions the contact pads of the die relative to contact sites of the leadframe.

18 Claims, 3 Drawing Sheets

METHOD OF ASSEMBLING A MODULE FOR A SMART CARD

TECHNICAL FIELD

The present invention relates generally to methods of packaging integrated circuits in smart cards and the like and more particularly to methods of assembling a chip module for attachment to a smart card.

BACKGROUND ART

Smart cards are typically wallet-sized plastic members having one or more embedded integrated circuit dies. The die of a smart card may be a microprocessor and/or one or more memory chips. A relatively few contact sites are needed to connect the smart card to a device for operating the card. Applications for a smart card include banking, security and access, and the storage of business or medical records.

In the manufacture of a smart card, a conventional technique is to form an electronic module separate from the card body to which the module is later attached. The module may include a frame comprising an underlayer of conductive material that is segmented to provide the contacts for operating the module. The underlayer is attached to a dielectric layer having areas that are punched out to expose the conductive underlayer. The die itself may be mounted in one of the exposed areas. Smaller exposed areas allow passage of wire bonds from contact pads of the die. Each wire bond electrically connects the die to one of the contact segments of the conductive underlayer. A dielectric material is then used to overcoat the die and the wire bonds, reducing the likelihood that handling will damage the module.

A number of difficulties arise from forming the electronic module in the manner described above. The most commonly used overcoat materials undergo shrinkage following curing. The shrinkage leaves a noticeable curve in the module. Automated pick-and-place equipment used in attaching modules to card bodies may have some difficulty in handling the curved modules. Because the module is flexible, wire bonds are not as reliable as other methods of providing input/output interconnections to the integrated circuit die. Moreover, wire bonds are often longer than interconnection pads of other connection schemes, adding resistance and reducing the speed of processing.

An alternative to separately fabricating electronic modules and card bodies is described in U.S. Pat No. 4,889,980 to Hara et al. A laminated card body is employed, with interior layers of the card having holes for a wiring substrate and an integrated circuit die. The outside layers of the card are entirely flat to completely enclose the wiring substrate and die. Projections of terminals are pressed through the upper layer to contact the wiring substrate for operation of the die. While Hara et al. overcome some of the difficulties described above, the multi-layered card may introduce other processing difficulties. Moreover, in many applications it is desirable to mass produce the electronic modules separately from the cards, so that an end-user can choose a unique card surface and any logos to be used on such a surface of the card.

It is an object of the present invention to provide a method of assembling a chip module for attachment to a card, wherein the module is reliably manufactured with a small number of fabrication steps and without aid of the card to which the chip module is to be attached.

SUMMARY OF THE INVENTION

The above object has been met by a method of assembling a chip module within a smart card that is independent of attachment of the chip to a card body, so that an end user may select a desired card body. The method reduces the number of steps and provides a module that is more easily handled by automated pick-and-place equipment.

The method of assembling the chip module includes forming a leadframe having an array of first contact sites on a first surface of a dielectric layer. On a second surface of the dielectric layer is a conductive layer that is segmented to form second contact sites. The second sites are used to make contact with a card reader after connection of the module to the card body. In a preferred embodiment, leads extend from the first contact sites and have outer lead ends that are connected to the second contact sites. For example, plated throughholes may be provided to achieve electrical communication between the first and second contact sites via the leads.

A die-alignment layer is attached to the first surface of the leadframe. The leadframe and the die-alignment layer are preferably coterminus and are each planar, forming an assembly that is rectangular and easy to handle by robotic equipment and the like. At the center of the die-alignment layer is an opening. The opening has the same configuration as the integrated circuit die, but has dimensions slightly greater than that of the die. The opening thereby creates a die-receiving cavity that functions to align the die.

A layer of conductive material is patterned on the active surface of the integrated circuit die to increase both the height and the area of the contact pads that are to make connection with the first contact sites of the leadframe. For example, a layer of gold may be added to a conventional die. The increased height facilitates connection to the first contact sites, while the increased area reduces the manufacturing tolerances in aligning the die to the leadframe.

Z-axis epoxy paste is then deposited within the die-receiving cavity formed by the die-alignment layer. "Z-axis epoxy" is defined as a material that displays unidirectional conductivity to provide conductivity in the Z direction perpendicular to opposing mating surfaces. In the present invention, the opposing mating surfaces are the first contact sites of the leadframe and the material-added contact pads of the die. Unidirectional conductivity is achieved by suspending conductive particles in a dielectric medium, wherein the suspended particles have a density that ensures that conductivity does not occur until the material is compressed between the opposing mating surfaces.

The integrated circuit die is then inserted into the die-receiving cavity, with the active side of the die facing the first surface of the leadframe. Compression and heat cure the Z-axis epoxy. Typically, a number of lead frames are formed in a web. After curing of the Z-axis epoxy, the individual modules can be excised from the web. Thus, the Z-axis epoxy, which is selective with respect to direction of electrical connection, is used to both electrically and mechanically connect an integrated circuit die to the remainder of the module.

One advantage of the present invention is that a flat module is fabricated, facilitating module handling. Assembly of the modules is independent of the connection of the modules to a card body. This allows an end user to select features that may be included with the card, such as an embedded identification photograph or magnetic strip.

Another advantage of the present invention is that the use of Z-axis epoxy provides a shorter signal path than is typically achieved in using wire bonds. Moreover, because the Z-axis epoxy is used for both a mechanical and an electrical attachment and also acts as an overcoat, assembly is simplified and the necessary materials are reduced. The overall thickness of the module is less than that of modules of the prior art. The reduction in thickness allows a card manufacturer to increase the strength of the card, since the cavity in the card body can be reduced in depth, leaving a greater amount of card material at the the card cavity.

BRIEF DESCRIPTION OF THE DRAWINGS

FIG. 1 is a perspective view of a module and card body for the of assembly of a smart card or the like.

BEST MODE FOR CARRYING OUT THE INVENTION

Figure 1:
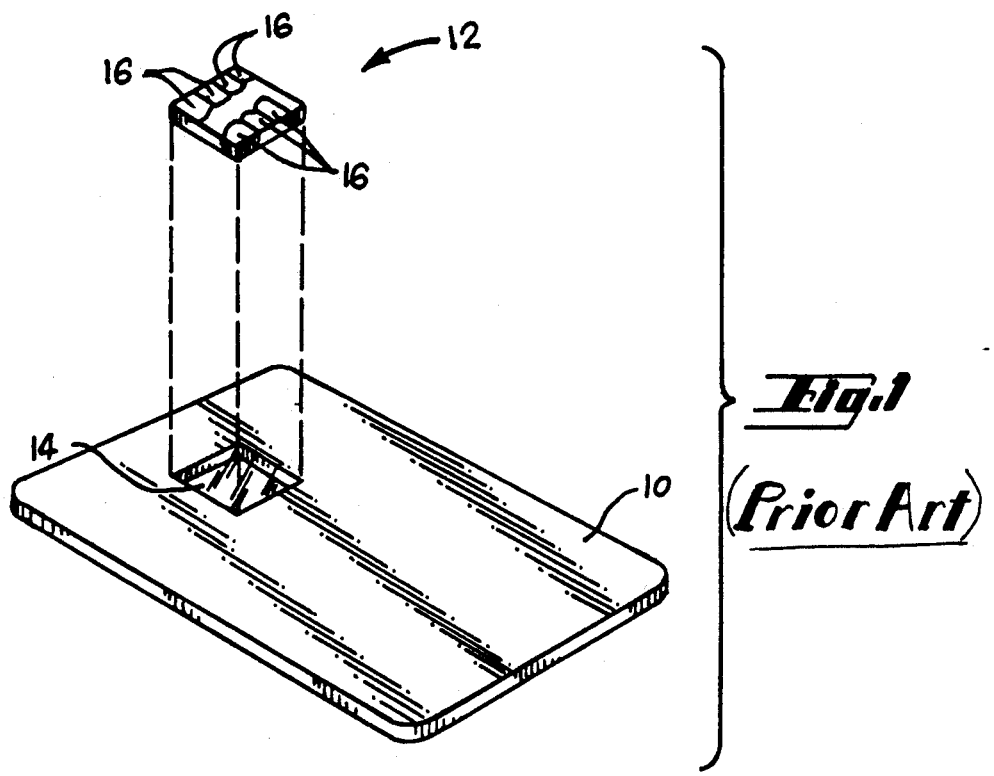

With reference to FIG. 1, a card body 10 and a chip module 12 are shown. The card body includes an opening 14 extending partially through the body. The lateral dimensions of the opening 14 are only slightly greater than the lateral dimensions of the chip module 12, so that the opening is completely covered when the module is adhered or otherwise attached to the card body.

The chip module 12 has a first surface, not shown, on which an integrated circuit die is mounted. On the opposite side is a pattern of conductive material, such as one ounce copper having a small amount of gold and nickel. The conductive coating is segmented to define eight isolated contact sites 16. Connecting the contact sites 16 to a card reader permits operation of the integrated circuit die on the opposite side of the module.

The card body 10 is typically made of a thermoplastic material, such as polyvinyl chloride, but this is not critical. The opening 14 does not extend entirely through the card body, so that a portion of the thermoplastic material remains to protect the integrated circuit die. The thickness of the material that remains is dependent upon the thickness of the structure that must be inserted within the opening 14. Thus, reducing the thickness of that portion of the module 12 that is inserted into the opening 14 will allow an increase in the remaining material of the card body at the opening. Using prior art techniques described below, only 6 to 9 mils of thermoplastic material remain, whereas the present invention allows a remainder in the range of 13.5 to 16.5 mils. This permits an increase in the strength of the card.

Figure 2:
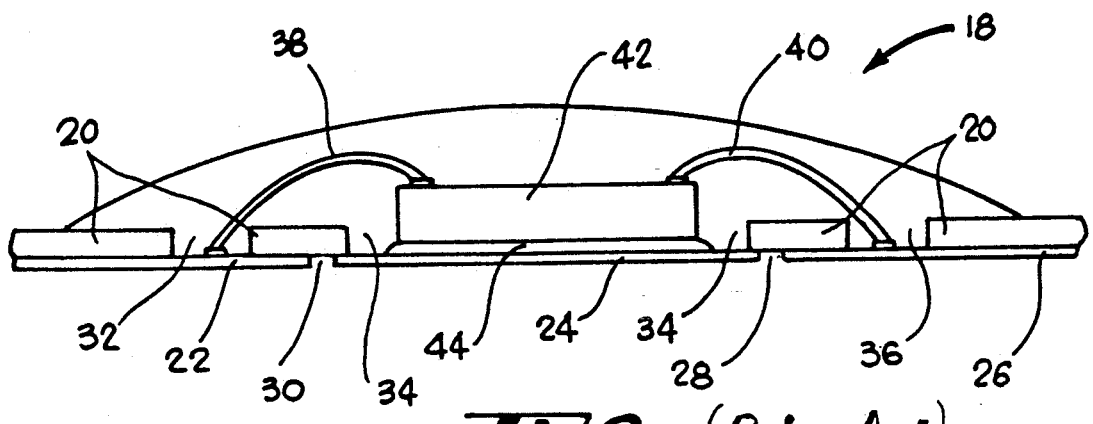
FIG. 2 is a side sectional view of an electronic module in accordance with the prior art.

Referring now to FIG. 2, a module 18 formed in accordance with the prior art method is shown. The module includes a dielectric substrate 20, with a layer of conductive material that is segmented to form isolated contact sites 22, 24 and 26 on a lower surface. The conductive lower surface has areas 28 and 30 in which the material is removed to isolate the contact sites 22-26. The thickness of the contact sites may be in the order of 0.0015 inch, but this is not critical.

The dielectric substrate 20 may be FR-4, a tradename, or may be any other type of insulative material. Preferably, the dielectric substrate is flexible. Regions 32, 34 and 36 are punched out of the substrate to expose the contact sites 22, 24 and 26. Wire bonds 38 and 40 are connected at inner ends to contact pads on an integrated circuit die 42 and extend through punched out regions 32 and 36 for electrical connection to contact sites 22 and 26. The die 42 is mounted onto the contact site 24 that is exposed by the punched out region 34. A non-conductive adhesive 44 attaches the die to the contact site 24. In applications in which the die is connected to ground potential, the ground may be established by using a conductive mounting adhesive and grounding the contact site 24.

Figure 3:
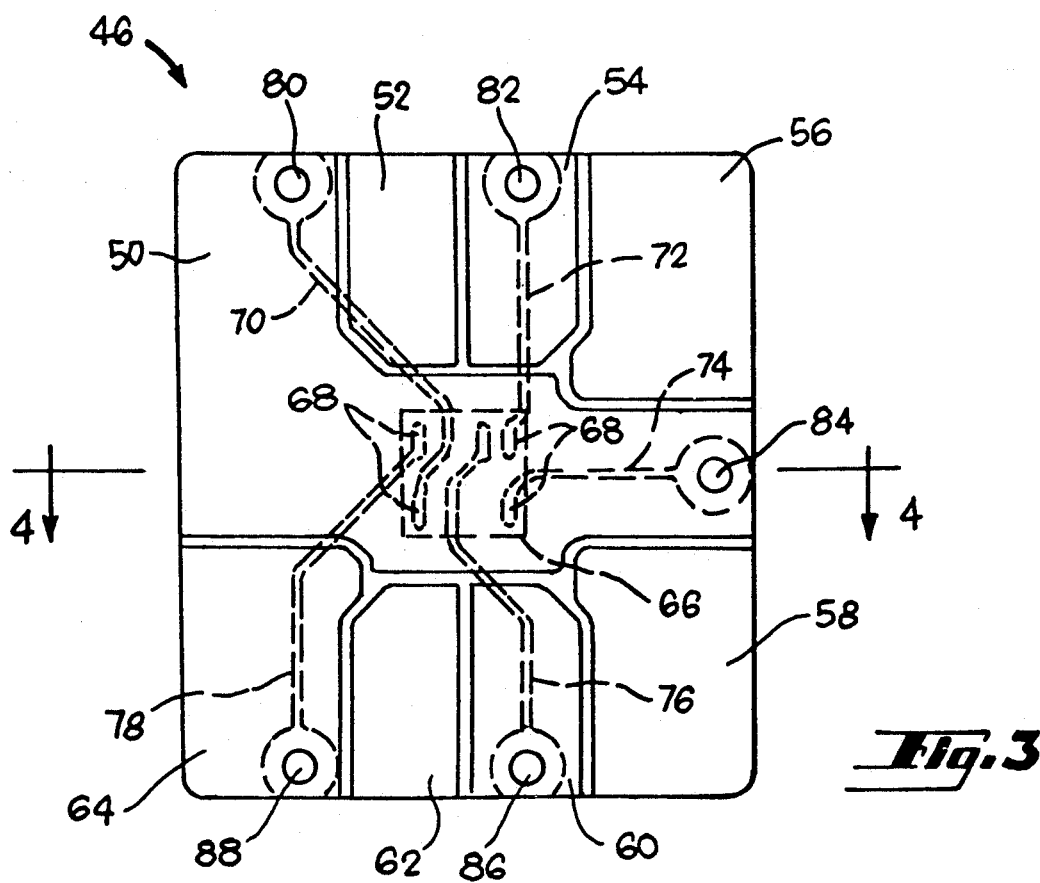
FIG. 3 is a bottom view of a leadframe in accordance with the present invention.
Figure 4:
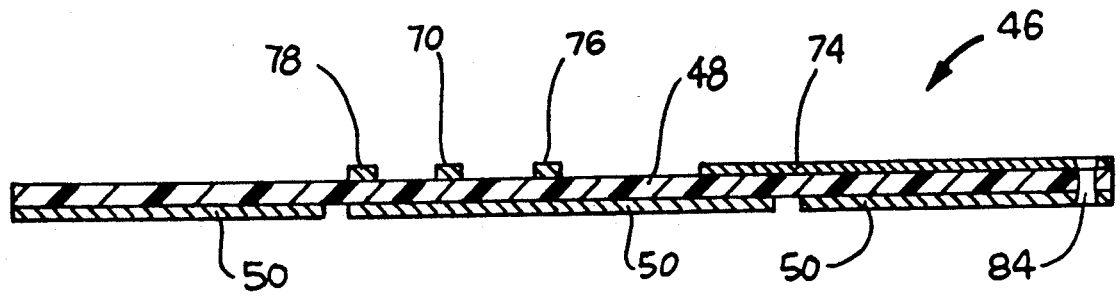
FIG. 4 is a side sectional view of the leadframe of FIG. 3 taken along lines 4—4.

FIGS. 3 and 4 illustrate a leadframe 46 in accordance with the present invention. Again, a dielectric substrate 48 is employed, but the thickness is significantly reduced. For example, rather than a thickness of 0.0045 inch as in the prior art described above, the thickness of the dielectric substrate 48 may be 0.025 inch. On each side of the dielectric substrate is a patterned layer of conductive material, such as one ounce copper having a small amount of gold and nickel. On the lower surface of the dielectric substrate is a layer of the conductive material that is segmented in the same manner described above to form eight contact sites 50, 52, 54, 56, 58, 60, 62 and 64. Using conventional techniques, material is removed from between the contact sites to provide electrical isolation.

On the side of the dielectric substrate 48 opposite to the contact sites 50-64 is a patterned conductive layer, shown in phantom in FIG. 3. Also shown in phantom is a center punched out region 66 of the dielectric substrate. An integrated circuit die is later mounted within the punched out region 66. Contact sites 68 are positioned within the region 66 for electrical connection to contact pads of the die. Leads 70, 72, 74, 76 and 78 have inner lead ends at the contact sites 68 and extend outwardly therefrom. At the outer lead ends are plated throughholes 80, 82, 84, 86 and 88. The throughholes 80-88 achieve electrical connection between the contact sites 68 on one side of the dielectric substrate 48 to the contact sites 50-64 on the opposite side. The conductive material on the opposite sides of the dielectric substrate 48 may have a thickness of 0.0014 inch, but this is not critical. Other schemes for achieving electrical connection between the contact sites 68 and the segment contact sites 50-64 may also be employed.

Figure 5:
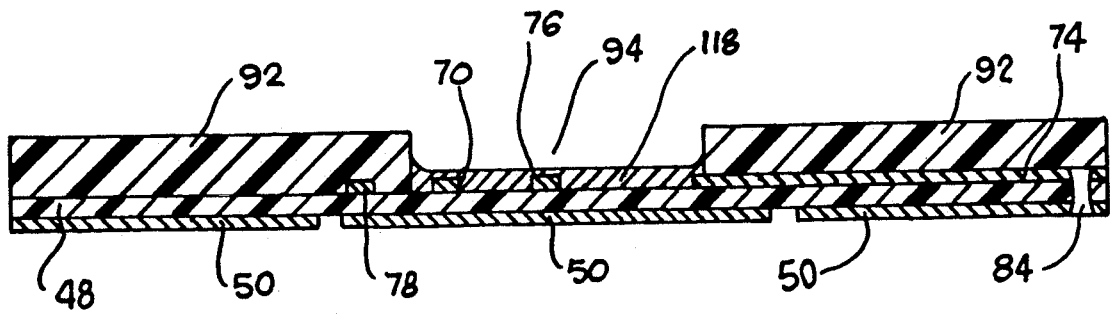
FIG. 5 is side sectional view of the leadframe of FIG. 4 having a die-alignment layer and Z-axis epoxy.

Referring now to FIG. 5, a die-alignment layer 92 is then provided at the surface of the leadframe. Preferably, the die-alignment layer is coterminus with the remainder of the leadframe. The material for making this layer may be the same as that of the dielectric substrate 48. At the center of the die-alignment layer is a rectangular opening 94. The opening acts as a die-receiving cavity. The configuration of the opening is substantially the same as the integrated circuit die. The dimensions are slightly greater than that of the die.

Figure 6:
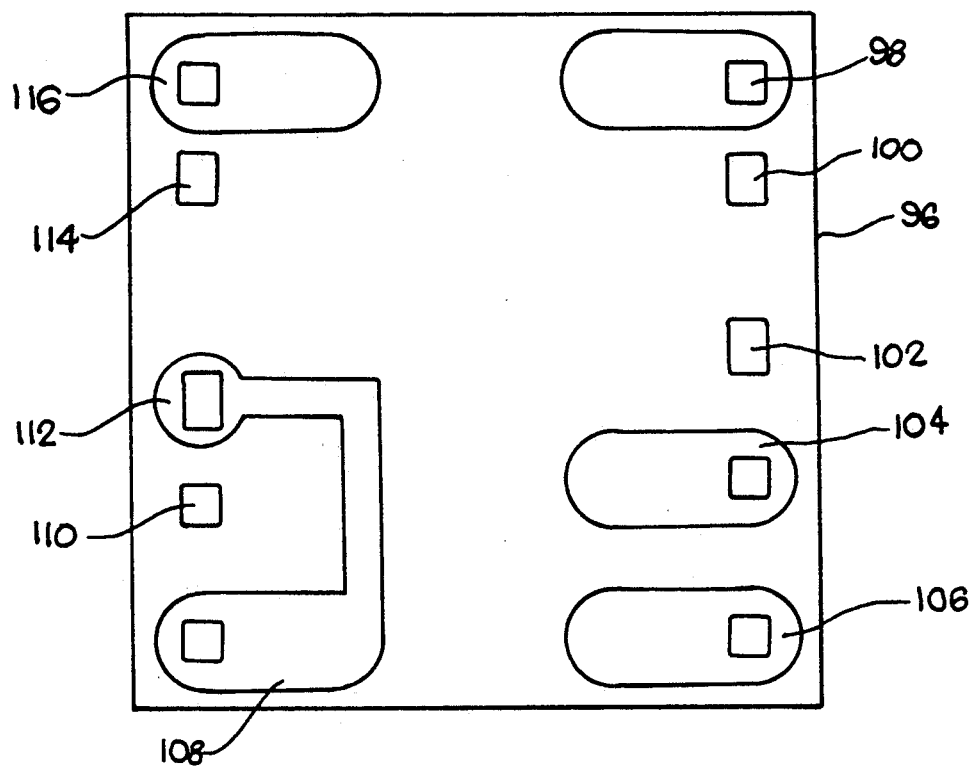
FIG. 6 is a bottom view of an active side of an integrated circuit die modified in accordance with the present invention.

The active side of the integrated circuit die 96 is shown in FIG. 6. Ten contact pads 98, 100, 102, 104, 106, 108, 110, 112, 114 and 116 provide utilities and signals to the die 96. The die is a conventional member which has been modified at the active surface in accordance with the present invention. That is, selected contact pads have been increased in area and raised slightly from the active surface to facilitate connection to the leadframe of FIG. 5. Contact pads 98, 104, 106, 108, 112 and 116 are increased in area and height. These pads are employed during use of a smart card. The contact pads 100, 102, 110 and 114 are utilized only in testing the die, so that these pads need not be attached to the leadframe. Therefore, the contact pads 100, 102, 110 and 114 are increased in height, but not area.

The contact pads 98, 104, 106, 108 and 116 that are to connect With the sites 68 in FIG. 3 are preferably configured in the same manner as the sites 68. As an example, these selected contact pads may have a length of 0.03 inch and a width of 0.012 inch.

Figure 7:
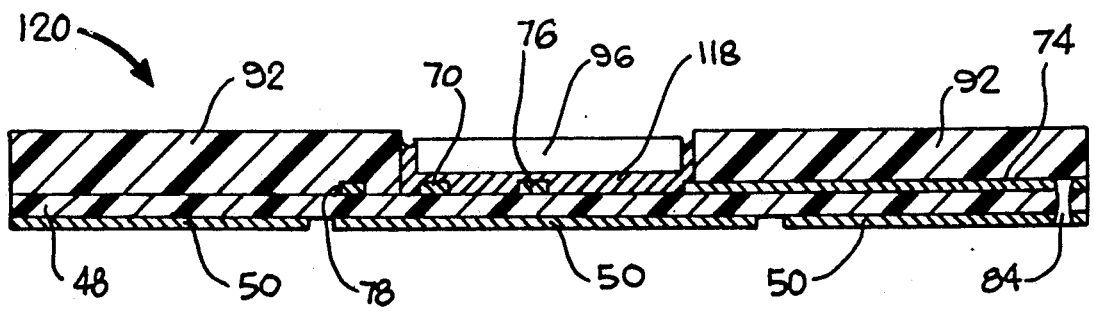
FIG. 7 is a sectional view of the module assembled in accordance with the present invention.

Returning to FIG. 5, electrical connection between the contact sites of the leadframe and the contact pads of the die is provided by use of a Z-axis epoxy paste 118. In the structure of FIG. 5, the epoxy does not electrically connect the lead 70 to the lead 76, since conductive particles within the epoxy 118 are sufficiently dispersed to prevent formation of an electrical path. However, the Z-axis epoxy is characterized by an ability to provide electrical connection when the epoxy is compressed between two conductive surfaces. In FIG. 7, the die 96 is shown as being inserted into the die-receiving cavity at the center of the layer 92. While not shown, the Z-axis epoxy paste is compressed between contact sites on the surface of the leadframe and contact pads on the active surface of the die 96.

The Z-axis epoxy 118 is typically cured using a combination of compression and heat. In an accelerated cure process, a pressure of from 20 to 40 psi is applied in a heated atmosphere of between 125° C. and 175° C. for a short period of up to 50 seconds. Alternatively, temperatures of 150° C. and less can be employed at the same pressure if the heating process is extended to a period of 30 to 60 minutes.

As noted above, the advantages of the module 120 shown in FIG. 7 include providing a card-independent manufacturing process to produce a module having opposed planar sides to facilitate handling by automatic equipment. While the method has been illustrated and explained in describing a single-chip module, multi-chip modules may also be manufactured using the present invention. The use of the Z-axis epoxy reduces the length of signal lines, as compared to employing bond wires. The integrated circuit die 96 is slightly recessed relative to the upper surface of the die-alignment layer 92. This aids in protecting the die.

I claim:

1. A method of assembling a module for attachment to a card comprising,
    providing a leadframe such that a first surface of the leadframe has an array of first contact sites for electrical connection to an integrated circuit die, the leadframe including an array of second contact sites on a second surface thereof,
    providing a die-alignment layer on the first surface of the leadframe such that the die-alignment layer includes an alignment cavity positioned to receive the integrated circuit die at the first contact sites,
    mounting the integrated circuit die within the die-alignment layer, wherein the integrated circuit die has contact pads on an active side and has dimensions less than the dimensions of the alignment cavity, the providing of the die-alignment layer including framing the alignment cavity such that the contact pads of the integrated circuit die are positioned atop the first contact sites on the first surface when the integrated circuit die is inserted in the alignment cavity, the first side of the integrated circuit die facing the first surface of the leadframe, and
    depositing conductive adhesive in the alignment cavity,
    compressing the conductive adhesive between the first contact sites and the contact pads to provide electrical connection therebetween.

2. The method of claim 1 wherein the step of mounting the integrated circuit die includes expanding the area of the contact pads, the expanding including patterning conductive material on the active side of the integrated circuit die.

3. The method of claim 2 wherein the patterning of the conductive material is such that the contact pads are increased in height relative to the active side of the integrated circuit die, the step of expanding the area and increasing the height providing increased reliability of electrically connecting the contact pads to the first contact sites.

4. The method of claim 1 wherein said conductive adhesive is Z-axis epoxy and further comprising curing the Z-axis epoxy, including heating the Z-axis epoxy within the alignment cavity following the step of inserting the integrated circuit die.

5. The method of claim 4 wherein the step of compressing the Z-axis epoxy includes flowing the Z-axis epoxy to areas of the alignment cavity adjacent to the IC die.

6. The method of claim 1 wherein the step of providing the die-alignment layer is a step of fixing an insulator layer to the leadframe such that the leadframe and the die-alignment layer are substantially coterminus.

7. The method of claim 1 wherein the step of forming the leadframe includes patterning a conductive material on the second surface to define the second contact sites.

8. A method of forming a module for attachment to a card comprising,
    providing an integrated circuit die having a pattern of contact pads on an active side of the die,
    increasing the area of the contact pads and increasing the height of the contact pads relative to the active side by patterning conductive material on the active side,
    providing a leadframe for connection to the die, including patterning first contact sites positionally corresponding to at least some of the contact pads and patterning leads extending outwardly from the first contact sites, the forming of the leadframe further including framing the first contact sites with a die-alignment layer, thereby creating a die-receiving cavity,
    inserting the die within the die-receiving cavity to trap the die and to align the contact pads with the first contact sites, and
    electrically connecting the contact pads to the contact sites, including depositing Z-axis epoxy within the die-receiving cavity between the leadframe and the die and including curing the Z-axis epoxy.

9. The method of claim 8 wherein the step of inserting the die includes pressing the die to a level below that of the die-alignment layer.

10. The method of claim 8 wherein the step of providing the leadframe includes patterning the first contact sites and the leads on a first surface of a dielectric support layer and patterning second contact sites on a second surface of the dielectric support layer.

11. The method of claim 10 wherein the step of providing the leadframe includes providing conductive paths from the leads on the first surface to the second contact sites on the second surface.

12. The method of claim 8 further comprising adding the die-alignment layer and the die into an opening in a card and fixing the leadframe to the card.

13. The method of claim 10 wherein the step of providing the leadframe is a step of forming a rectangular leadframe having generally planar upper and lower sides for attachment to a card having substantially greater dimensions.

14. A method of manufacturing a card comprising, providing an integrated circuit die having contact pads,
forming a leadframe, including patterning the contact sites on a first surface of a flexible dielectric substrate and patterning second contact sites on a second surface,
attaching a dielectric layer to the first surface such that an opening through the dielectric layer exposes the first contact sites, the opening having a configuration corresponding to the die,
forming a layer of conductive adhesive on the first surface,
aligning the contact pads of the die with the first contact sites of the leadframe and inserting the die into the opening, the aligning being maintained by the corresponding configuration of the die and the opening,
curing the adhesive, thereby electrically connecting the first contact sites to aligned contact pads, and
inserting the dielectric layer and the die into a card, leaving the second contact sites on the second surface of the leadframe exposed for operation of the card.

15. The method of claim 14 wherein the step of attaching the dielectric layer is a step of attaching a layer having a height slightly greater than the height of the die and having a width and length generally equal to that of the dielectric substrate.

16. The method of claim 15 wherein the step of attaching the dielectric layer is a step of attaching a dielectric layer having a width and length that are each less than one inch.

17. The method of claim 14 wherein the step of forming a leadframe includes forming traces from the first contact sites for electrically connecting the first and second contact sites.

18. The method of claim 17 wherein the step of forming the leadframe includes forming throughholes passing through the dielectric substrate to electrically connect the first and second contact sites.

* * * * *